(12) United States Patent
Yamagata

(10) Patent No.: US 11,764,009 B2
(45) Date of Patent: Sep. 19, 2023

(54) DEVICE AND SWITCH DEVICE

(71) Applicant: ALPS ALPINE CO., LTD., Tokyo (JP)

(72) Inventor: Kazuyoshi Yamagata, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 220 days.

(21) Appl. No.: 17/344,021

(22) Filed: Jun. 10, 2021

(65) Prior Publication Data

US 2021/0304985 A1 Sep. 30, 2021

Related U.S. Application Data

(63) Continuation of application No. PCT/JP2019/043507, filed on Nov. 6, 2019.

(30) Foreign Application Priority Data

Dec. 12, 2018 (JP) ................... 2018-232646

(51) Int. Cl.
| | |
|---|---|
| *H01H 13/06* | (2006.01) |
| *H01H 23/12* | (2006.01) |
| *H01H 23/06* | (2006.01) |
| *H05K 7/14* | (2006.01) |

(52) U.S. Cl.
CPC ............ *H01H 23/12* (2013.01); *H01H 23/06* (2013.01); *H05K 7/1427* (2013.01)

(58) Field of Classification Search
CPC ........ H01H 13/06; H01H 23/06; H01H 3/125; H01H 13/705; H01H 13/14; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20
See application file for complete search history.

(56) References Cited

U.S. PATENT DOCUMENTS

2009/0057114 A1* 3/2009 Yamamoto ............. H01H 13/06
29/622

FOREIGN PATENT DOCUMENTS

| JP | S61-168474 U | 10/1986 |
|---|---|---|
| JP | H02-098420 U | 8/1990 |
| JP | H06-056932 U | 8/1994 |
| JP | H08-222066 | 8/1996 |
| JP | H09-185921 | 7/1997 |

OTHER PUBLICATIONS

International Search Report for PCT/JP2019/043507 dated Jan. 7, 2020.

* cited by examiner

*Primary Examiner* — Ahmed M Saeed
(74) *Attorney, Agent, or Firm* — IPUSA, PLLC

(57) ABSTRACT

A device includes a housing, a circuit board disposed inside the housing, and an elastic seat covering one surface on one side of the circuit board, wherein the housing includes a wall having one opening provided on the one side and another opening provided on another side which is other than the one side, the wall extending between the one opening and the another in a direction intersecting in a direction in which the one surface of the circuit board extends, wherein the elastic seat has a flange, and wherein the flange contacts the wall so as to deflect against the wall.

8 Claims, 10 Drawing Sheets

DEVICE AND SWITCH DEVICE

CROSS-REFERENCE TO RELATED APPLICATIONS

The present application is a continuation application of International Application No. PCT/JP2019/043507, filed Nov. 6, 2019, which claims priority to Japanese Patent Application No. 2018-232646, filed Dec. 12, 2018. The contents of these applications are incorporated herein by reference in their entirety.

BACKGROUND OF THE INVENTION

1. Field of the Invention

The present invention relates to a device and switch device.

2. Description of the Related Art

Conventionally, a technique has been devised in which the surface of the circuit board disposed inside a housing is covered with a cover made of an elastic material such as rubber, so that the waterproof property of the circuit board can be improved. For example, Patent Document 1 discloses a technique of covering the entire upper surface of a wiring board provided with a fixed contact, a light emitting element, or the like with a rubber seat in a switch device.
Patent Document 1: Japanese Unexamined Utility Model Application No. Hei 2-98420

In the background art, however, water may intrude into the circuit board by entering the inside of the housing and circulating from the surface of the cover through the outside of the edge of the cover to the back side of the cover. In order to prevent such a situation, there is a need for a technique that may enhance waterproof property of the circuit board provided inside the housing.

SUMMARY OF THE INVENTION

A device of the embodiment includes a housing, a circuit board disposed inside the housing, and an elastic seat covering one surface on one side of the circuit board, wherein the housing includes a wall having one opening provided on the one side and another opening provided on another side which is other than the one side, the wall extending between the one opening and the another in a direction intersecting in a direction in which the one surface of the circuit board extends, wherein the elastic seat has a flange, and wherein the flange contacts the wall so as to deflect against the wall.

DETAILED DESCRIPTION OF THE PREFERRED EMBODIMENTS

Hereinafter, one embodiment will be described with reference to the drawings.

(Outline of Power Seat Switch 100)

Figure 1:
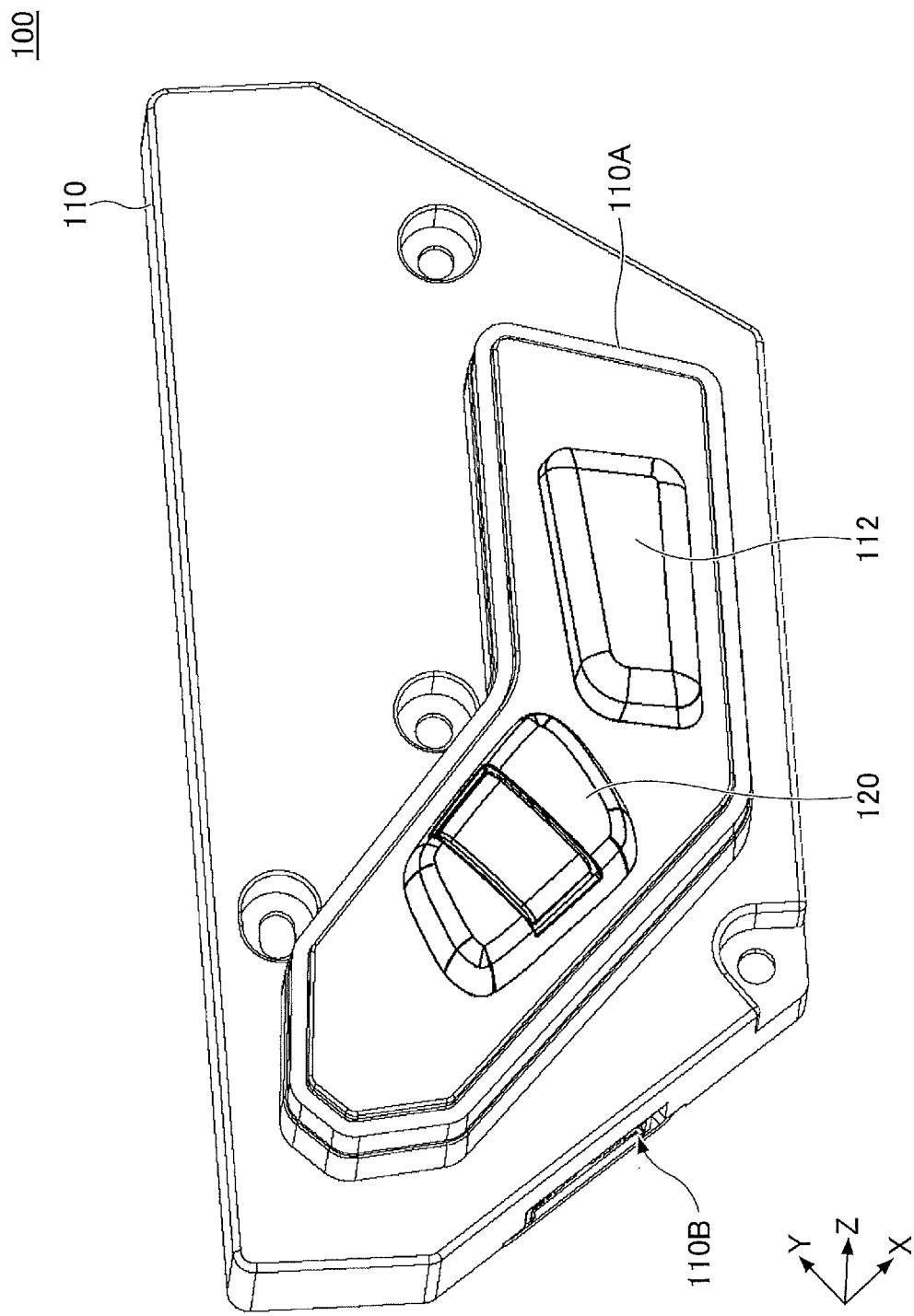
FIG. 1 is a perspective view of a power seat switch according to an embodiment

FIG. 1 is a perspective view of a power seat switch 100 according to the embodiment. The power seat switch 100 illustrated in FIG. 1 is an operation device for controlling the height of the seat of the vehicle and adjusting the reclining angle. For example, the power seat switch 100 may be positioned at a predetermined position inside the vehicle (e.g., on the interior side of the door on the side of the driver's seat). In this embodiment, for convenience, the Z-axis positive direction in the drawings is set to direct upward (one example of "one" in the claim), and the Z-axis negative direction in the drawings is set to be downward (one example of "the other" in the claim).

As illustrated in FIG. 1, the power seat switch 100 includes a main unit 110. The main unit 110 has a base section 110A that is partially raised from its surface. The base section 110A is provided with a switch device 120 and a slide operator 112. The switch device 120 (an example of a "device" and a "switch device" as claimed in the claims) is an operating member which is operated to adjust the reclining angle of the power seat, and has a so-called rocker switch which is built in the switch device 120 and can de operated to adjust the angle or position of the headrest. The slide operator 112 is an operating member that is operated to adjust the forward and backward positions of the power seat.

The power seat switch 100 is electrically connected to a control unit mounted on the vehicle side via a connector and a cable by connecting a connector (not illustrated) on the distal end of a cable pulled out from the vehicle side to a receptacle 110B provided on the side of the main unit 110. Thus, the power seat switch 100 outputs an electrical signal corresponding to the operation of the switch device 120 and the slide operator 112 to the control unit and causes the control unit to control the power seat.

(Installation Structure of Switch Device 120)

Figure 2:
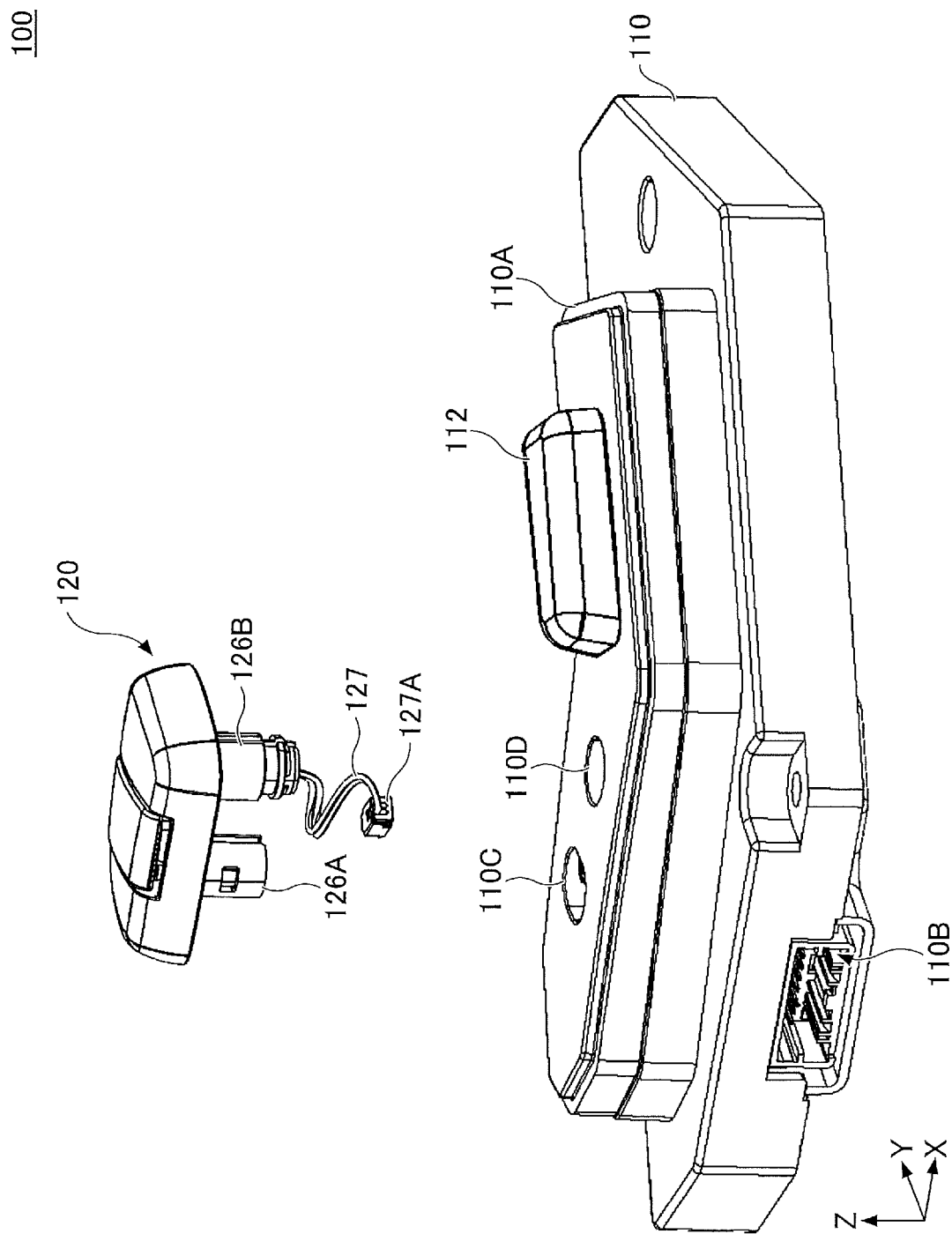
FIG. 2 illustrates an installation structure of a switch device in the power seat switch according to the embodiment.

FIG. 2 is a diagram illustrating an installation structure of the switch device 120 in the power seat switch 100 according to the embodiment. As illustrated in FIG. 2, the switch device 120 can be installed in a base section 110A of the main unit 110.

Specifically, the base section 110A is formed with openings 110C and 110D having a circular shape. On the other hand, the switch device 120 is provided with cylindrical portions 126A and 126B having a cylindrical shape projecting downwardly from the bottom surface of a lower cover 126 (see FIG. 3) below.

The cylindrical portion 126A is inserted from the opening 110C into the base section 110A and fits into other components (not illustrated) provided within the base section 110A. The cylindrical portion 126B is inserted from the opening 110D into the base section 110A and fits into other components (not illustrated) provided within the base section 110A. Thus, the switch device 120 is mounted to the base section 110A so as not to easily come off the base section 110A.

The switch device 120 includes a cable 127 that passes through the inside of the cylindrical portion 126B and is pulled out from the front edge of the cylindrical portion 126B. A connector 127A on the front end of the cable 127 is connected to a connector (not illustrated) on a circuit board inside the main unit 110 to electrically connect to a circuit board inside the main unit 110.

(Structure of Switch Device 120)

Hereinafter, the switch device 120 will be described in detail. In the following description, for convenience, the Z-axis direction in the drawing is set to the vertical direction, and the X-axis direction and the Y-axis direction in the drawing are set to the horizontal direction.

Figure 3:
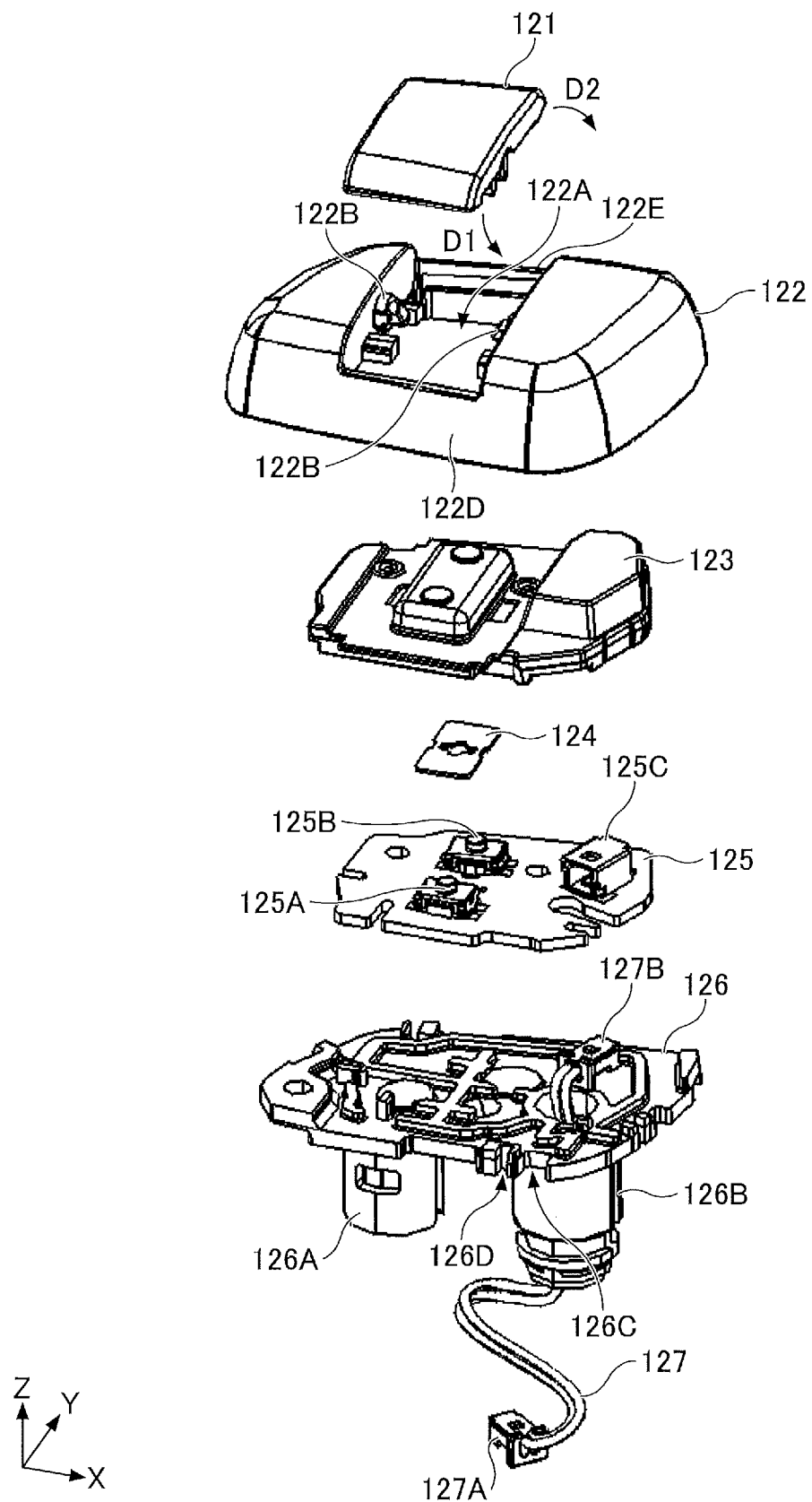
FIG. 3 is an exploded perspective view of the switching device according to the embodiment.

FIG. 3 is an exploded perspective view of a switch device 120 according to the embodiment. As illustrated in FIG. 3, the switch device 120 includes, from the top of the figure, an operation knob 121, housing 122, rubber cap 123, spacer 124, a circuit board 125, lower cover 126, and cable 127.

The operation knob 121 is an operating member of the rocker switch and is disposed in an upper opening 122A (for example, one opening as claimed) formed on the upper side of the housing 122 and is rotatably supported by the housing 122 to the first and second rotating directions D1 and D2, respectively, which are in different rotational directions. The operation knob 121 is a member in which the pivot shaft is used as a boundary for the pressing operation on one end side and the other end side, respectively, and the pressing operation on one end side or the other end side is performed by the user. By being pressed, the operation knob 121 rotates in the first or second rotating directions D1 and D2, and presses a switch 125A or switch 125B mounted on the circuit board 125 to activate an adjustment function of the angle or position of the head rest of the power seat. For example, the operation knob 121 is formed by injection molding a resin material.

Figure 7:
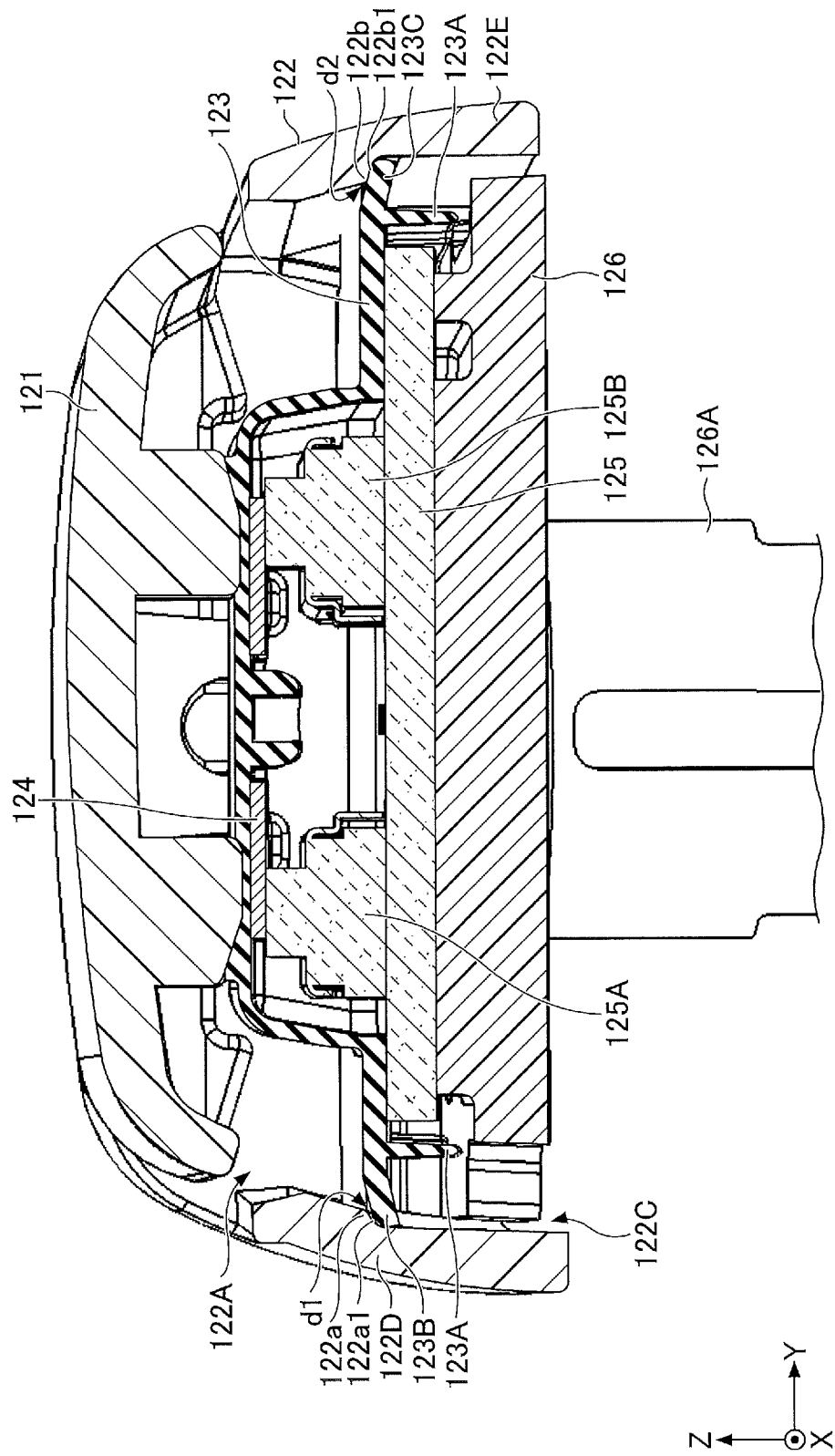
FIG. 7 is a cross-sectional view on a YZ-plane of the switch device according to the embodiment.

The housing 122 is a container-like member having a lower opening 122C (one example of the "another opening" as claimed) on the lower side (see FIG. 7). A generally rectangular upper opening 122A is formed on the upper side of the housing 122 in a plan view viewed from above. An operation knob 121 having a shape substantially the same as the upper opening 122A is disposed in the upper opening 122. The upper opening 122A is formed by a pair of inner wall surfaces provided substantially parallel to the YZ plane and facing each other in the drawing and the upper ends of the walls 122D, 122E (described in paragraphs 0037, 0038) provided to connect the inner wall surfaces. Each of the inner walls is provided with a protruding shaft support 122B for pivotally supporting the operation knob 121. For example, the housing 122 may be formed by injection-molding a resin material.

A rubber cap 123 is an example of an "elastic seat" as claimed and is a member that covers the upper side of the circuit board 125. The circuit board 125 is covered by a rubber cap 123 to enhance the waterproof property. For example, the rubber cap 123 is formed by press-molding elastic material such as rubber, silicon, or the like. The rubber cap 123 has a three-dimensional shape in which a portion overlapping the electronic component (e.g., the switches 125A and 125B, connector 125C) is hollowed out so that the electronic components mounted on the surface of the circuit board 125 can be covered.

The spacer 124 is a flat plate-like member provided within a gap between the upper surfaces of the switches 125A and 125B and the inner top surface of the rubber cap 123 to fill the gap.

The circuit board 125 is a flat plate-like member in which a plurality of electronic components is installed. For example, the circuit board 125 may be a PWB (Printed Wiring Board) made of an insulating material such as glass epoxy. The switch 125A, switch 125B and connector 125C are installed on the surface of the circuit board 125. The switch 125A outputs a switch signal for moving the headrest of the power seat closer to or farther away from the user when the switch 125A is pressed by the operation knob 121 rotating in the first rotating direction D1 of the operation knob 121. The switch 125B outputs a switch signal for moving the headrest of the power seat headrest in a direction away from the user or closer to the user when the switch 125B is pressed into the second rotating direction D2 of the operation knob 121. The connector 125C allows a switch signal output from the switches 125A and 125B to be delivered to the main unit 110 via the cable 127 when the connector 127B provided at the other end of the cable 127 is connected. The lower cover 126 is a flat member that closes the lower opening 122C in the housing 122 by supporting the lower surface of the circuit board 125 by mounting the circuit board 125 and attaching to the lower opening 122C in the housing 122. Cylindrical portions 126A, 126B each having a cylindrical shape protrudes downwardly from the lower surface of the lower cover 126.

The cable 127 is a wiring member for transmitting a switch signal output from switches 125A and 125B from the circuit board 125 to the main unit 110. The cable 127 passes through the interior of the cylindrical portion 126B provided in the lower cover 126 and is drawn out of the housing 122. One end of the cable 127 is provided with a connector 127A. The connector 127A is connected to a connector (not illustrated) provided within the main unit 110. The other end of the cable 127 is provided with the connector 127B. The connector 127B is connected to a connector 125C provided on the circuit board 125. For example, the cable 127 may be a copper wire coated with an insulating material such as polyethylene, vinyl, or the like.

(Structure of Rubber Cap 123)

Figure 4:
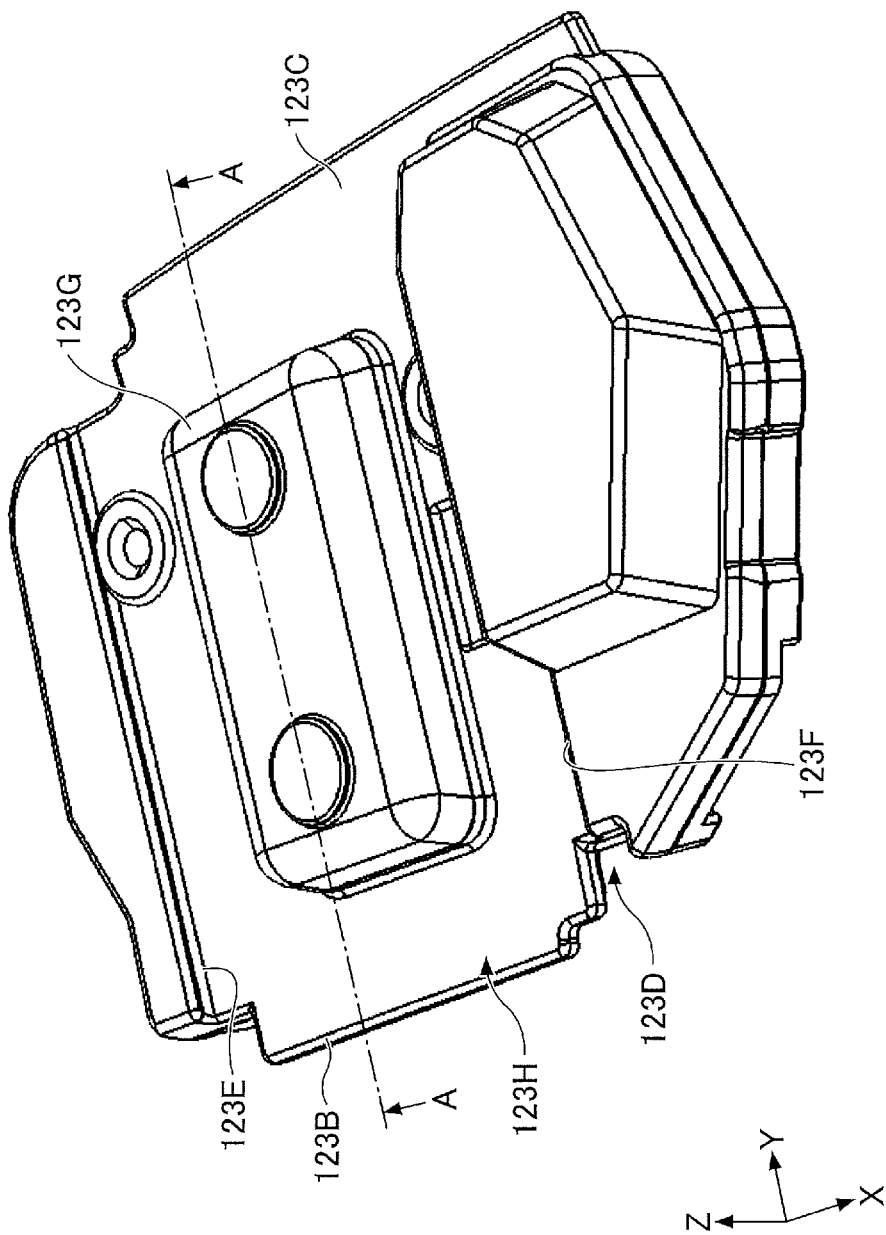
FIG. 4 is a perspective view of the top surface of a rubber cap according to an embodiment.
Figure 5:
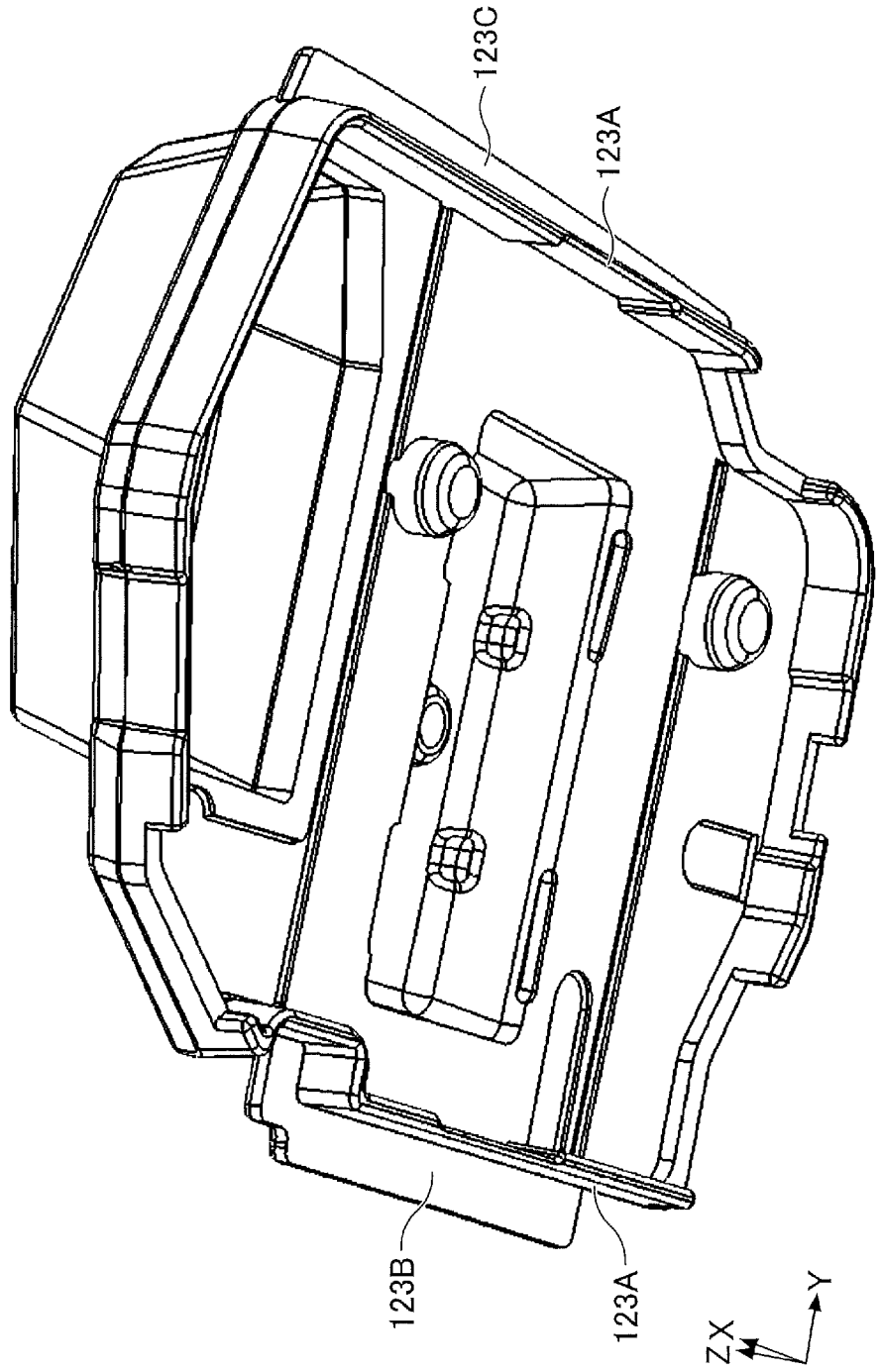
FIG. 5 is a perspective view of the bottom surface of the rubber cap according to the embodiment.
Figure 6:
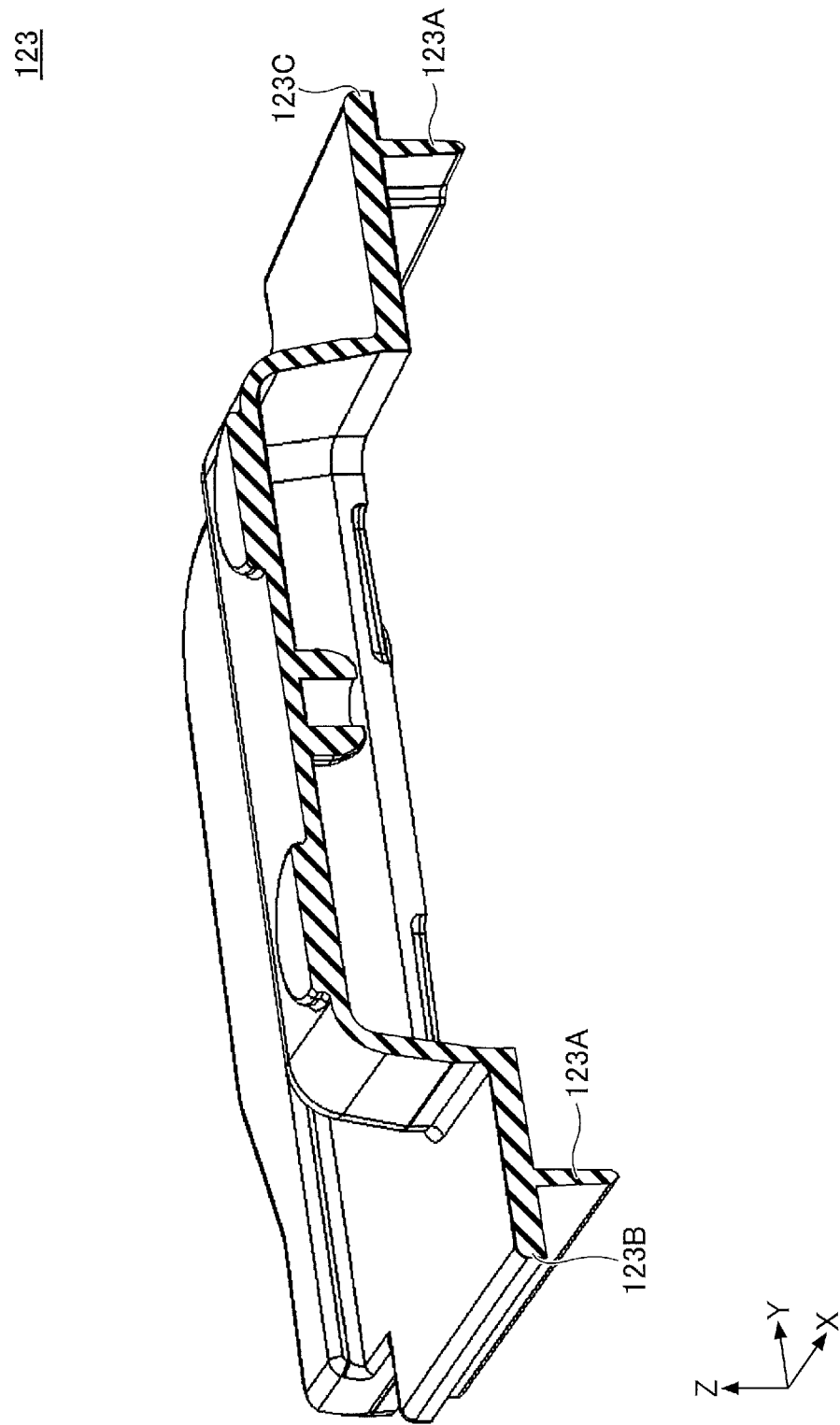
FIG. 6 is a cross-sectional view taken along a line A-A of the rubber cap.

FIG. 4 is a perspective view of the rubber cap 123 viewed from the upper surface of the rubber cap 123 according to an embodiment. FIG. 5 is a perspective view of the rubber cap 123 viewed from the bottom surface of the rubber cap 123 according to the embodiment. FIG. 6 is a cross-sectional view of the rubber cap 123 illustrated in FIG. 4 taken along a line of A-A.

As illustrated in FIGS. 4-6, the rubber cap 123 includes a skirt portion 123A, a flange 123B, a flange 123C, a notch 123D, a regulating portion 123E, and a regulating portion 123F.

The skirt portion 123A is an example of the "skirt portion" as claimed and is a skirt-like portion formed downwardly from the lower surface of the rubber cap 123. The skirt portion 123A is formed in a circumferential wall to surround a circuit board 125 disposed on the lower surface side of the rubber cap 123.

The flange 123B is an example of the "flange" as claimed in the claims and is a horizontal flat plate-like portion extending linearly in the X-axis direction of the drawing along a portion of the negative side of the Y-axis of the skirt portion 123A of the rubber cap 123 and extending toward the negative side of the Y-axis in the drawing.

The flange 123C is another example of a "flange" as claimed and is a horizontal flat plate-like portion extending linearly in the X-axis direction of the drawing along a portion of the positive side of the Y-axis of the skirt portion 123A of the rubber cap 12 and extending toward the positive side of the Y-axis in the drawing.

As illustrated in FIG. 6, the negative side of the Y-axis of the rubber cap 123 has a cross-sectional shape in which the flange 123B extends horizontally and outwardly and the skirt portion 123A extends downwardly from the base portion of the flange 123B.

As illustrated in FIG. 6, the flange 123C extends horizontally and outwardly on the positive side of the Y-axis in the drawing of the rubber cap 123, and the skirt portion 123A extends downwardly from the base portion of the flange 123C.

The notch 123D is an example of the "first drain" recited in the claims, wherein a portion of the peripheral portion of the rubber cap 123 is cut into the inside (the positive side of the Y-axis in the drawing). As illustrated in FIGS. 4 and 5, within this embodiment, the notch 123D is formed by cutting a portion of the flange 123B into the end of the downstream side (the positive side of the X-axis in the figure) on the flow path of water on the upper surface of the flange 123B when the water intrudes into the upper surface side of the rubber cap 123. The "downstream side" means the side where the object falls in the direction of gravity when the power seat switch 100 is installed in the vehicle at a predetermined position, i.e., the downstream side of the water flow generated by gravity. The notch 123D may be formed adjacent to the flange 123B through the flange 123B from the upper side to the lower side.

The regulating portions 123E and 123F are walls formed by a portion of the rubber cap 123 being raised like a seat. The regulating portion 123E is a wall-like portion that is linearly disposed along the Y-axis in the drawing on the negative side of the X-axis in the drawing rather than the protruding portion 123G that covers the switches 125A and 125B. The regulating portion 123E is formed in the rubber cap 123 like the seat on the negative side of the X-axis relative to the area 123H where the protruding portion 123G is provided in the drawing. The regulating portion 123F is a wall-like part that is linearly disposed along the Y-axis in the drawing on the positive side of the X-axis rather than the protruding portion 123G in the drawing. The regulating portion 123F is formed like the seat in the rubber cap 123 at the portion in the positive side in the X-axis relative to a region 123H provided with the protruding portion 123G in the drawing. The flange 123B is provided at the negative side of the Y-axis in the drawing of the region 123 interposed between the regulating portion 123E and the regulating portion 123F in the rubber cap 123. Thus, the rubber cap 123 enables water to be guided to the flange 123B while regulating water by the regulating portions 123E and 123F to prevent water intruding into the interior of the housing 122 from flowing out of the region 123H.

(Cross-Sectional Structure of Switch Device 120)

FIG. 7 is a cross-sectional view of the switch device 120 on the YZ plane according to an embodiment. As illustrated in FIG. 7, the switch device 120 incorporates, in the housing 122, a rubber cap 123, spacer 124, circuit board 125, and lower cover 126 overlapping one another from the lower opening 122C of the housing 122 with the operation knob 121 attached to the upper opening 122A of the housing 122, and further the lower cover 126 is screwed to be secured to the housing 122. The switch device 120 enables the switches 125A and 125B to be pressed through the rubber cap 123 and spacer 124 by a pressing operation of the operation knob 121.

In the switch device 120 illustrated in FIG. 7, the upper surface, which is present on the upper side of the circuit board 125, is covered by the rubber cap 123 throughout the area. Thus, the switch device 120 can prevent water from intruding onto the circuit board 125 from the upper side by means of the rubber cap 123 even when water intrudes into the housing 122 through a gap present around the operation knob 121 at the upper opening 122A.

Additionally, in the switch device 120, the circuit board 125 is surrounded by a skirt portion 123A like a peripheral wall provided on the side of the lower surface of the rubber cap 123. In particular, the skirt portion 123A extends downwardly to a position below the lower surface of the circuit board 125. This allows the switch device 120 to prevent water from intruding into the circuit board 125 from the side using the skirt portion 123A even if water enters the lower side of the rubber cap 123.

On the negative side of the Y-axis in the drawing of the switch device 120 in the state illustrated in FIG. 7, the housing 122 has a wall 122D that extends in the direction intersecting the direction (in the XY-plane direction) in which the positive side of the Z-axis of the circuit board 125 or one surface of the negative side of the Z-axis in the drawing extends between the upper opening 122A formed in the positive side of the Z-axis in the drawing and the lower opening 122C formed in the negative side of the Z-axis in the drawing. Then, the flange 123B of the rubber cap 123 abuts against the inner surface of the wall 122D, and the flange 123B is pressed against the wall 122D and is disposed in a downwardly deflected state. Therefore, because the wall 122D and the flange 123B closely contact each other so that there is no gap between them, the switch device 120 can allow water to flow in the downstream direction (the positive direction along the X-axis in the drawing) along the upper surface of the flange 123B without water of flowing toward the lower surface of the flange 123B even if water enters onto the upper surface of the rubber cap 123. In particular, the switch device 120 has a groove d1 formed by the upper surface of the flange 123B and the inner surface of the wall 122D by the flange 123B deflecting downward, so that water that intrudes into the housing 122 flows inside the groove d1. Thus, water intruding into the housing 122 can be more reliably guided in a downstream direction of the flange 123B.

Similarly, in the switch device 120 illustrated in FIG. 7, on the positive side of the Y-axis in the drawing, the housing 122 is provided with a wall 122E that intersects the plane formed by the circuit board 125. Then, the flange 123C of the rubber cap 123 abuts against the inner surface of the wall 122E and the flange 1230 is pressed against the wall 122E and disposed in a downwardly deflected state. Accordingly, because the wall 122E and the flange 123C closely contact each other so that there is no gap between them, the switch device 120 can allow water to flow in the downstream direction (the positive direction along the X-axis in the drawing) along the upper surface of the flange 123C without water of flowing toward the lower surface of the flange 123C even if water enters onto the upper surface of the rubber cap 123. In particular, the switch device 120 has a groove d2 formed using the upper surface of the flange 1230 and the inner surface of the wall 122E due to downward deflecting of the flange 123C so that water intruding into the housing 122 flows inside the groove d2. Accordingly, water intruding into the housing 122 can be more reliably guided in the downstream direction of the flange 123C.

As illustrated in FIG. 7, the walls 122D and 122E have the pressing portions 122a and 122b that contact the flanges 123B and 123C. The pressing portions 122a and 122b include the "slope portion" as claimed) that are provided so that the lower side (the negative side of the Z-axis) than the upper side (the positive side of the Z-axis) is away from the rubber cap 123. The pressing portions 122a and 122b are examples of the "pressing portions" recited in the claims and form narrow portions which partially narrow the space between the wall 122D and the wall 122E within the housing 122. The narrow portion is formed in a position slightly overlapping the upper surface of the flange 123C. When the rubber cap 123 is pushed in against the narrow portion from the lower side, the narrow portion abuts the flanges 123B and 123C, thereby deflecting the flanges 123B and 123C downward. Thus, when the switch device 120 pushes the rubber cap 123, spacer 124, circuit board 125, and lower cover 126 from the lower opening 122C of the housing 122 to a predetermined height within the housing 122 to cause the flanges 123B, 123C to be deflected downwardly by the pressing portions 122a, 122b.

That is, the switch device 120 can easily incorporate each component into the housing 122, while having a high water stoppability effected by the flanges 123B and 123C. The switch device 120 is also capable of allowing manufacturing errors of the flanges 123B and 123C to be allowed by the amount of deflection of the flanges 123B and 123C by allowing the flanges 123C to flex downwardly deflect.

Further, the switch device 120 can selectively flex only the distal end of the flanges 123B and 123C of the rubber cap 123 by reinforcing the base portions of the flanges 123B and 123C, which are the branch points, by providing the skirt portions 123A at the base portions of the flanges 123B and 123C, thereby preventing lifting from the circuit board 125 of the other portions of the rubber cap 123.

(Water Flow in Switch Device 120)

Figure 8:
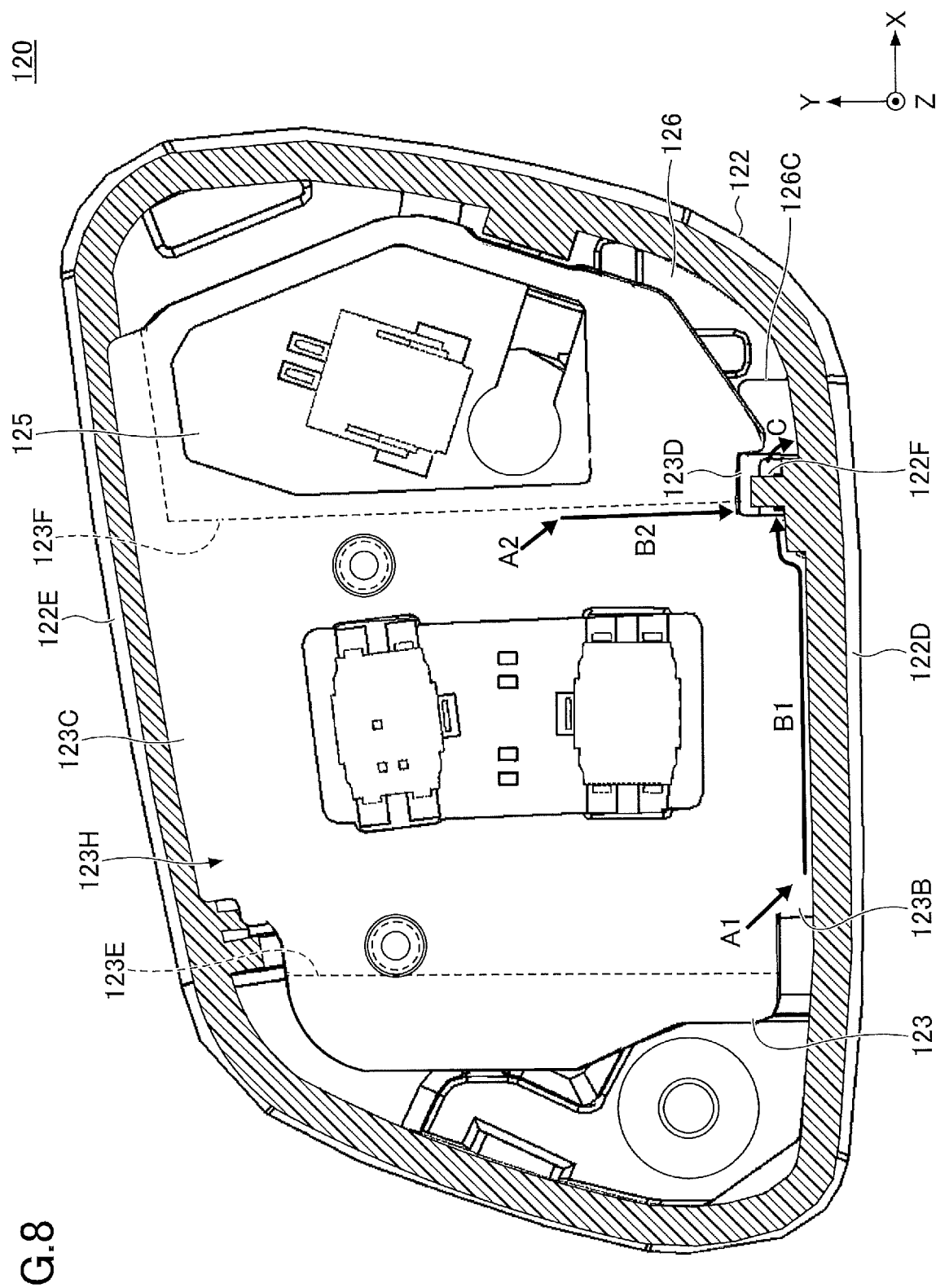
FIG. 8 is a cross-sectional view on an XY plane of the switching device according to the embodiment.

Referring to FIG. 8, the flow of water in the switch device 120 will be described. FIG. 8 is a cross-sectional view in XY plane of the switch device 120 according to the embodiment.

Water that intrudes into the housing 122 from the upper opening 122A flows into the region 123H between the regulating portion 123E and the regulating portion 123F provided on the top surface of the rubber cap 123 at a location overlapping the upper opening 122A.

Water flow to the region 123H flows through the region 123H into the flange 123B formed on the negative side of the Y-axis in the drawing of the region 123H by effecting gravity, as indicated by arrow A1 in FIG. 8. Alternatively, water flowing into the region 123H flows through the region 123H to the regulating portion 123F formed on the positive side of the X-axis in the figure of the region 123H according to gravity, as illustrated by the arrow A2 in FIG. 8.

Water flowing into the regulating portion 123F flows downstream (Y-axis negative direction in the figure) along the regulating portion 123F according to gravity, as illustrated by an arrow B2 in FIG. 8, from the notch 123D formed on the downstream side of the regulating portion 123F through the flange 123B and onto the upper surface of the lower cover 126.

Meanwhile, water flowing into the flange 123B flows in a downstream direction (the positive direction along the X-axis in the drawing) along the flange 123B according to gravity, as shown by the arrow B1 in FIG. 8, and flows from the notch 123D formed on the downstream side of the flange 123B to the upper surface of the lower cover 126 through the flange 123B.

In particular, because the groove d1 (see FIG. 7) is formed in a sealing portion between the flange 123B and the wall 122D by the downward deflecting of the flange 123B, water flowing into the flange 123B flows inside the groove d1 to more reliably be guided to the notch 123D.

Water flowing down to the upper surface of the lower cover 126 passes through the lower cover 126 from a drain port 126C (one example of the "second drain" as claimed) formed on the lower cover 126 downstream (on the positive side of the X-axis in the drawing) from the notch 123D at the edge, as indicated by an arrow C in FIG. 8, and flows out of the switch device 120. In this embodiment, the drain port 126C is formed by notching a portion of the edge of the lower cover 126 at a position corresponding to the notch 123D of the rubber cap 123. The drain port 126C may be formed so as to penetrate through the lower cover 126 from the upper side to the lower side.

As illustrated in FIG. 8, the notch 123D is notched inwardly to avoid interference with the rib 122F formed on the inner surface of the wall 122D. The ribs 122F are provided for engaging the engagement grooves 126D (see FIG. 3) formed at the edges of the lower cover 126 to facilitate positioning of the lower cover 126 relative to the housing 122. That is, the notch 123D is provided with a function to avoid interference with the ribs 122F and a function to drain the rubber cap 123 to the back side.

(Structure of Mounting Surface 126E of Lower Cover 126)

Figure 9:
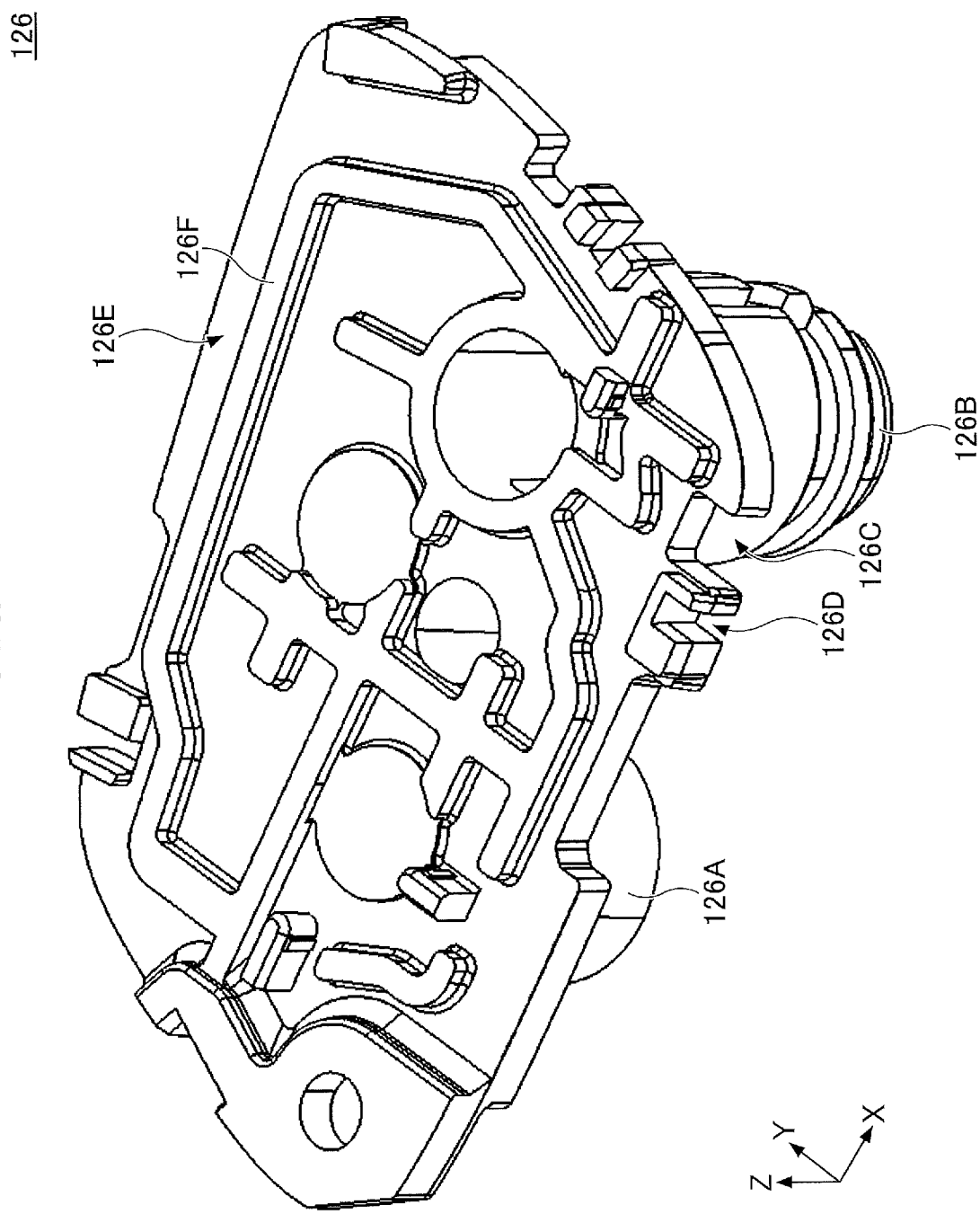
FIG. 9 is a perspective view of a lower cover according to the embodiment.

FIG. 9 is a perspective view of the lower cover 126 according to the embodiment. As illustrated in FIG. 9, the lower cover 126 includes a rib 126F projecting upwardly from the mounting surface 126E of the lower cover 126 and being provided in a dam shape so that the upper side contacts the lower surface of the circuit board 125 and the contacting surface between the lower cover 126 and the circuit board 125 surrounds a wiring pattern formed on the lower surface of the circuit board 125. The rib 126F is an example of a "rib" as recited in the claims and functions as a water stop wall to prevent water from intruding into the region surrounded by rib 126F because the height of the rib is higher than that of mounting surface 126E. A region, which is a part of the lower surface of the circuit board 125 surrounded by the ribs 126F, is a region where a high waterproof property is required. For example, wiring patterns and through-holes may be provided in the region.

(Prohibited Area 125D)

Figure 10:
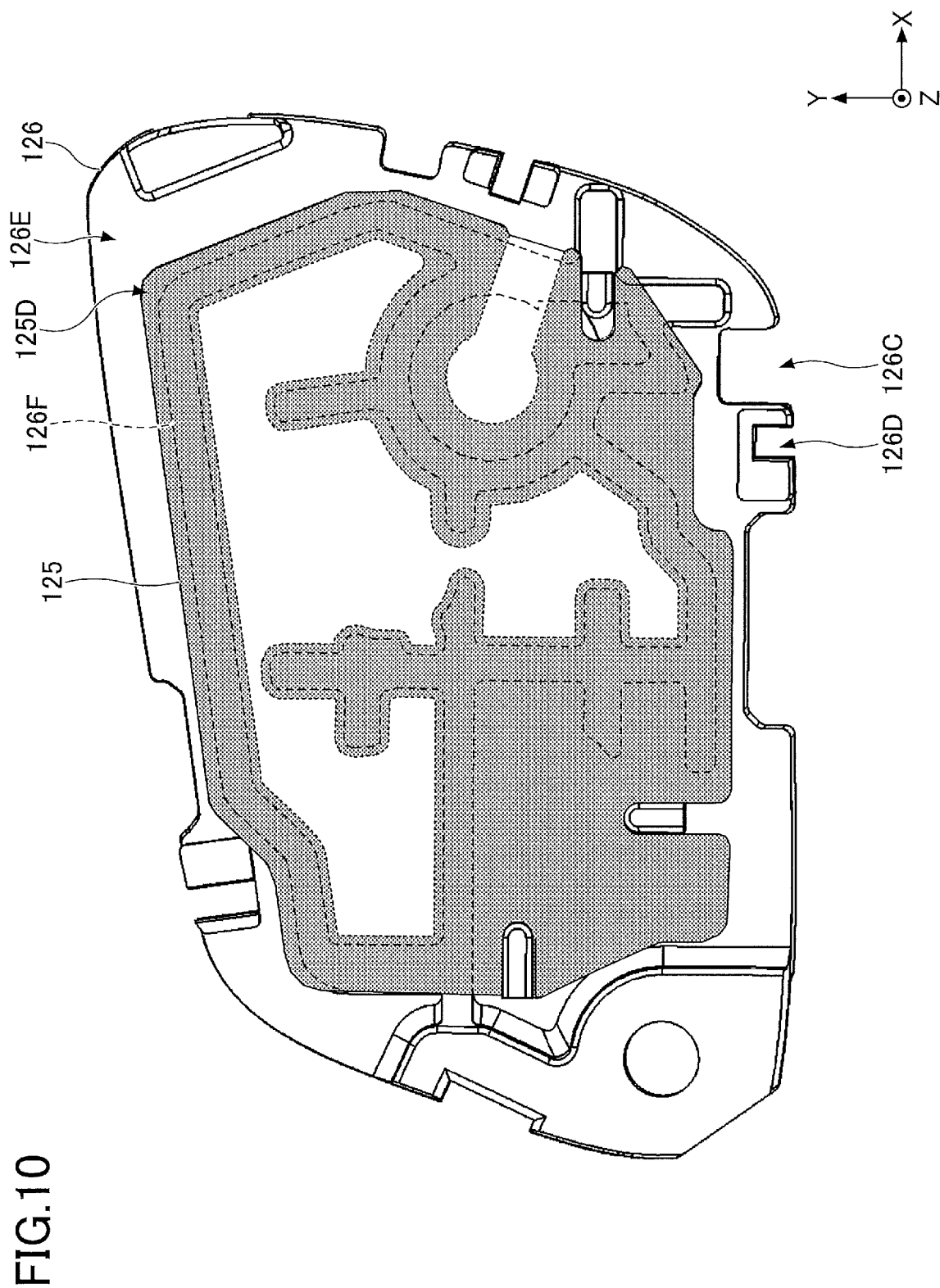
FIG. 10 illustrates a prohibited area defined in a circuit board according to the embodiment.

FIG. 10 is a diagram illustrating a prohibited area 125D defined in circuit board 125 according to the embodiment. FIG. 10 illustrates the circuit board 125 mounted on the mounting surface 126E of the lower cover 126. Also illustrated in FIG. 10, the ribs 126F on the back side of the circuit board 125 are indicated by dashed lines, and the prohibited area 125D defined on the lower surface of the circuit board 125 is hatched.

As illustrated in FIG. 10, an area outside of an area surrounded by the contacting surface of the ribs 126F on the lower surface of the circuit board 125 is defined as the prohibited area 125D. The prohibited area 125D is an area where wiring patterns and through holes are prevented from being installed. Said differently, the switch device 120 in this embodiment does not have a wiring pattern and through hole in the prohibited area 125D of the circuit board 125. Accordingly, the switch device 120 according to this embodiment suffers no malfunction, such as electric corrosion of the wiring pattern or immersion of the surface side of the circuit board 125 through the through hole, even if the prohibited area 125D of the circuit board 125 is immersed in water.

Also, as illustrated in FIG. 10, the prohibited area 125D is enlarged slightly inward of the rib 126F. This prevents the wiring pattern and the through hole from being provided in the flooded area even when the circuit board 125 is slightly submerged in the area surrounded by the ribs 126F due to the gap between the upper surface of the ribs 126F that abut each other and the lower surface of the circuit board 125. Therefore, the wiring pattern is electrically corroded, and the surface side of the circuit board 125 is immersed in water through the through hole, etc. are prevented from occurring.

The prohibited area 125D may be provided with a ground pattern. The ground pattern does not cause a problem such as water immerse, there is no potential difference and there is no problem such as electric corrosion because an electric potential is not generated even if water immerses.

As described above, the switch device 120 in accordance with the embodiment has the rubber cap 123 covering the upper surface of the circuit board 125 and having the flanges 123B and 123C disposed in a flexed state by being pressed against the walls 122D and 122E of the housing 122. Accordingly, the switch device 120 according to the embodiment can maintain a hermetic contact of the flanges 123B and 123C against the inner surfaces of the walls 122D and 122E by the elastic recovery force of the flanges 123B and 123C. In particular, the switch device 120 according to the embodiment allows manufacturing errors of the flanges 123B and 123C to be tolerated by the amount of deflection of the flanges 123B and 123C by allowing the flanges 123B and 123C to be pressed against the inner surfaces of the walls 122D and 122E to remain hermetic. Thus, according to the switch device 120 of the embodiment, the rubber cap 123 prevents the water immersion from the upper surface side of the rubber cap 123 and prevents the water immersion to the lower side of the rubber cap 123 from the gap between the flanges 123B and 123C and the walls 122D and 122E, thereby enhancing waterproof property for the circuit board 125 provided within the housing 122.

In the switch device 120 according to the embodiment, the walls 122D and 122E include the flanges 123B and 123C and the pressing portions 122a and 122b provided with the slopes 122a1 and 122b1 provided so that the lower side is away from the rubber cap 123 than the upper side. Thus, the switch device 120 according to the embodiment can cause the flanges 123B and 123C to be deflected downwardly by the pressing portions 122a and 122b by simply pushing the rubber cap 123 and the circuit board 125 from the lower opening 122C of the housing 122 to a predetermined height into the housing 122. Thus, the switch device 120 in accordance with an embodiment can provide an advanced waterproof property to the circuit board 125 provided within the housing 122, and also enhance easiness in assembling the switch device 120.

Also, in the switch device 120 according to the embodiment, the rubber cap 123 has the skirt portion 123A extending along the periphery of the rubber cap 123 and extending downwardly from the base portion of the flanges 123B and 123C, This allows the switch device 120 of the embodiment to prevent water from intruding into the circuit board 125 from the side of the circuit board 125 even if water intrudes into the lower side of the flanges 123B and 123C by the skirt portion 123A. In addition, the switch device 120 according to the embodiment is able to selectively flex only the front end side of the flanges 123B and 123C because the base portion of the flanges 123B and 123C, which are the branch points, is reinforced by the provision of the skirt portion 123A, so that lifting of the rubber cap 123 from the circuit board 125 can be suppressed. Thus, the switch device 120 in accordance with the embodiment can enhance the waterproof property for the circuit board 125 provided within the housing 122.

Also, in the switch device 120 according to an embodiment, the skirt portion 123A is provided in the peripheral wall surrounding the circuit board 125. This allows the switch device 120 in accordance with the embodiment to prevent water immersion into the circuit board 125 from the side of the circuit board 125 throughout the outer periphery of the circuit board 125 by using the skirt portion 123A. Thus, the switch device 120 in accordance with the embodiment can further enhance the waterproof property of the circuit board 125 disposed inside the housing 122.

Also, in the switch device 120 according to the embodiment, the rubber cap 123 has the notch 123D formed on a path in which the flanges 123B and 123C extend, extending from an upper side to a lower side, or formed by notching a portion of the flanges 123B, 123C. This allows the switch device 120 in accordance with one embodiment to drain water flowing on the flanges 123B and 123C from the notch 123D to the lower side of the flanges 123B and 123C. That is, the switch device 120 according to the embodiment can prevent water from accumulating on the flanges 123B and 123C. Therefore, the water immersion into the bottom surface side of the rubber cap 123 from the gap between the flanges 123B and 123C and the walls 122D and 122E can be made more difficult to occur. Thus, in the switch device 120 of the embodiment, the waterproof property to the circuit board 125 provided within the housing 122 can be further enhanced.

Also, in the switch device 120 of the embodiment, the lower cover 126 blocking the lower opening 122C in the housing 122 has a drain port 126C formed corresponding to the notch 123D or extending from an upper side of the lower cover 126 to a lower side of the lower cover 126 or formed by cutting the edge of the lower cover 126. This allows the switch device 120 according to the embodiment to discharge water flowing from the cutout 123D onto the lower cover 126 from the drain port 126C to the lower side of the lower cover 126 (i.e., the outside of the switch 120). That is, the switch device 120 in accordance with an embodiment can prevent water from accumulating on the lower cover 126, thereby making it more difficult to immerse the circuit board 125 from between the rubber cap 123 and the lower cover 126. Thus, the switch device 120 of the embodiment can be more waterproof to the circuit board 125 provided within the housing 122.

Also, in the switch device 120 of the embodiment, the lower cover 126 includes the rib 126F which protrudes upwardly from the mounting surface 126E of the lower cover 126 and is provided in a dam-like shape so that the upper side contacts the lower surface of the circuit board 125 and the contacting surface of the circuit board 125 surrounds a wiring pattern formed on the lower surface of the circuit board 125. Thus, the switch device 120 of the embodiment can be prevented by the rib 126F from immersing in a region of a portion of the lower surface of the circuit board 125 (e.g., a region where the wiring pattern and through hole may be provided) by water, even if water intrudes into the mounting surface 126E of the lower cover 126. Thus, in the switch device 120 of the embodiment, the waterproof property for the circuit board 125 provided within the housing 122 can be further enhanced.

Also, in the switch device 120 of the embodiment, the circuit board 125 is not provided with either a wiring pattern or a through hole in the region outside of the region surrounded by the ribs 126F on the lower surface of the circuit board 125 (the prohibited area 125D). Thus, the switch device 120 of the embodiment can prevent the wiring pattern from being electrically corroded, the surface side of the circuit board 125 from being immersed in water through the through hole, or the like, even if the prohibited area 125D of the circuit board 125 is immersed in water.

While the embodiment of the invention has been described in detail above, the invention is not limited to this embodiment, and various modifications or variations are possible within the scope of the invention as defined in the appended claims.

For example, in the above embodiment, the invention has been described by way of example in the switch device having an operation knob for operating the power seat. However, the invention is not limited thereto and is applicable to any apparatus having a structure in which one side of the circuit board is covered with an elastic seat at least inside the housing.

This international application claims priority under Japanese Patent Application No. 2018-232646, filed Dec. 12, 2018, the entire contents of which are incorporated herein by reference.

Although the present invention has been described with reference to the above-described embodiments, the present invention is not limited to the above-described embodiments, and may be improved or modified for purposes of improvement or within the spirit of the invention.

According to an embodiment, a waterproof property in a circuit board provided inside a housing can be increased.

DESCRIPTION OF SYMBOLS

100: Power seat switches
110: Main unit
110A: Base section
120: Device
121: Operation knob
122: Housing
122a, 122b: Pressing part
122C: Lower Opening
122D, 122E: Wall
123: Rubber caps (elastic seats)
123A: Skirt
123B, 123C: Flange
123D: Notch (first drain)
124: Spacer
125: Circuit boards
125D: Prohibited area
126: Under cover
126C: Drain port (second drain)
126E: Mounting surface
126F: Rib
127: Cable

What is claimed is:

1. A device comprising:
a housing;
a circuit board disposed inside the housing; and
an elastic seat covering one surface of the circuit board, the one surface being located on a first side of the device,
wherein the housing includes
a wall having a first opening provided on the first side and a second opening provided on a second side of the device which is other than the first side, the wall extending between the first opening and the another in a direction intersecting in a direction in which the one surface of the circuit board extends,
wherein the elastic seat has a flange and a first drain,
wherein the flange contacts the wall so as to deflect against the wall, and
wherein the first drain is adjacent to the flange, the first drain being formed to penetrate from the first side to the second side, the first drain being formed by notching a part of the flange.

2. The device according to claim 1,
wherein the wall has a pressing portion, the pressing portion including a slope portion provided so that the slope portion on the second side is farther than the slope portion on the first side relative to the elastic seat, the pressing portion contacting the flange.

3. The device according to claim 1,
wherein the elastic seat has a skirt portion, the skirt portion extending from a base portion of the flange portion toward the second side.

4. The device according to claim 3,
wherein the skirt portion is, formed like a peripheral wall surrounding the circuit board.

5. The device according, to claim 1, the device further comprising:
a lower cover that blocks the second opening, the lower cover including a second drain, the second drain being formed to penetrate from the first side to the second side, the lower cover being formed to notch a part of the lower cover corresponding to the first drain.

6. The device according to claim 5,
wherein the lower cover including a rib, the rib protruding, into the first side in a dam-like shape, the rib contacting the circuit board on the second side, the rib being provided to be in a shape of, surrounding a wiring pattern formed on the second side.

7. The device according to claim 6,
wherein the circuit board does not have neither the wiring pattern nor a through hole in an area outside a region surrounded by a contact surface of the circuit board on the second side.

8. A switch device for operating a power seat of a vehicle, the switch device comprising:
a housing;
a circuit board disposed inside the housing; and
an elastic seat covering one surface of the circuit board, the one surface being located on a first side of the device,
wherein the housing includes
a wall having a first opening provided on the first side and a second opening provided on a second side of the device which is other than the first side, and the wall extending between the first opening and the another in a direction intersecting in a direction in which the one surface of the circuit board extends,
wherein the elastic seat has a flange and a first drain,
wherein the flange contacts the wall so as to deflect against the wall, and
wherein the first drain is adjacent to the flange, the first drain being formed to penetrate from the first side to the second side, the first drain, being formed by notching a part of the flange.

* * * * *